(12) United States Patent
Hsu et al.

(10) Patent No.: US 11,081,397 B2
(45) Date of Patent: Aug. 3, 2021

(54) FORMING A PROTECTIVE LAYER TO PREVENT FORMATION OF LEAKAGE PATHS

(71) Applicant: Taiwan Semiconductor Manufacturing Co., Ltd., Hsin-Chu (TW)

(72) Inventors: Leo Hsu, Hsinchu (TW); Louis Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/601,454

(22) Filed: Oct. 14, 2019

(65) Prior Publication Data

US 2020/0043800 A1   Feb. 6, 2020

Related U.S. Application Data

(63) Continuation of application No. 16/016,945, filed on Jun. 25, 2018, now Pat. No. 10,446,449, which is a
(Continued)

(51) Int. Cl.
*H01L 21/8234*   (2006.01)
*H01L 21/768*   (2006.01)
(Continued)

(52) U.S. Cl.
CPC .. *H01L 21/823475* (2013.01); *H01L 21/0217* (2013.01); *H01L 21/28008* (2013.01);
(Continued)

(58) Field of Classification Search
CPC ....... H01L 2924/0002; H01L 29/66545; H01L 27/10897; H01L 21/76831
See application file for complete search history.

(56) References Cited

U.S. PATENT DOCUMENTS 5,219,792 A    6/1993  Kim et al.
6,319,822 B1 * 11/2001  Chen ................... H01L 21/0332
                                                     257/E21.035
(Continued)

FOREIGN PATENT DOCUMENTS

CN    103400799      11/2013
KR    20090044582     5/2009
(Continued)

*Primary Examiner* — Zandra V Smith
*Assistant Examiner* — Andre C Stevenson
(74) *Attorney, Agent, or Firm* — Haynes and Boone, LLP

(57) ABSTRACT

A gate structure is formed over a substrate. The gate structure includes a gate electrode and a hard mask located over the gate electrode. The hard mask comprises a first dielectric material. A first interlayer dielectric (ILD) is formed over the gate structure. The first ILD comprises a second dielectric material different from the first dielectric material. A first via is formed in the first ILD. Sidewalls of the first via are surrounded by spacers that comprise the first dielectric material. A second ILD is formed over the first ILD. A via hole is formed in the second ILD. The via hole exposes the first via. A protective layer is formed in the via hole. A bottom segment of the protective layer is removed. Thereafter, an etching process is performed. A remaining segment of the protective layer prevents an etching of the spacers during the etching process.

20 Claims, 8 Drawing Sheets

Related U.S. Application Data continuation of application No. 15/364,488, filed on Nov. 30, 2016, now Pat. No. 10,008,416.

(51) Int. Cl.
*H01L 21/02* (2006.01)
*H01L 21/28* (2006.01)
*H01L 21/3105* (2006.01)
*H01L 21/311* (2006.01)

(52) U.S. Cl.
CPC .. *H01L 21/31058* (2013.01); *H01L 21/31111* (2013.01); *H01L 21/31144* (2013.01); *H01L 21/76802* (2013.01); *H01L 21/76816* (2013.01); *H01L 21/76831* (2013.01); *H01L 21/76877* (2013.01); *H01L 21/02115* (2013.01); *H01L 21/02274* (2013.01); *H01L 2221/1063* (2013.01)

(56) References Cited

U.S. PATENT DOCUMENTS

| | | | |
|---|---|---|---|
| 7,667,271 B2 | 2/2010 | Yu et al. |
| 7,910,453 B2 | 3/2011 | Xu et al. |
| 8,377,779 B1 | 2/2013 | Wang |
| 8,399,931 B2 | 3/2013 | Liaw et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 2003/0006444 A1* | 1/2003 | Amo ............... H01L 27/105 257/296 |
| 2012/0086057 A1 | 4/2012 | Kim |
| 2014/0001574 A1 | 1/2014 | Chen et al. |
| 2014/0110755 A1 | 4/2014 | Colinge |
| 2014/0151812 A1 | 6/2014 | Liaw |
| 2015/0235922 A1 | 8/2015 | Chen et al. |
| 2015/0235958 A1* | 8/2015 | Lin ............... H01L 21/76897 257/746 |
| 2015/0270716 A1 | 9/2015 | Waffenschmidt |
| 2016/0218035 A1 | 7/2016 | Yang et al. |

FOREIGN PATENT DOCUMENTS

| | | |
|---|---|---|
| TW | 200727452 A | 7/2007 |
| TW | 201304059 A | 1/2013 |
| TW | 201405751 A | 2/2014 |

* cited by examiner

FORMING A PROTECTIVE LAYER TO PREVENT FORMATION OF LEAKAGE PATHS

PRIORITY DATA

The present application is a continuation application of U.S. patent application Ser. No. 16/016,945 filed on Jun. 25, 2018, now issued as U.S. Pat. No. 10,446,449, which is a continuation of U.S. patent application Ser. No. 15/364,488 filed on Nov. 30, 2016, entitled "Forming a Protective Layer to Prevent Formation of Leakage Paths", now issued as U.S. Pat. No. 10,008,416, the disclosures of which are hereby incorporated by reference in their entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

However, existing semiconductor fabrication may still have certain drawbacks. One drawback is that, as semiconductor devices continue to get scaled down, certain fabrication processes may cause unintended consequences. For example, the formation of conductive vias/contacts may involve etching a hard mask. This etching process may cause other components (that have the same or similar material composition as the hard mask) to be unintentionally etched through. As a result, a leakage path may be created, which could create undesirable electrical shorting that could lead to degraded device performance or failures.

Therefore, while existing semiconductor devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
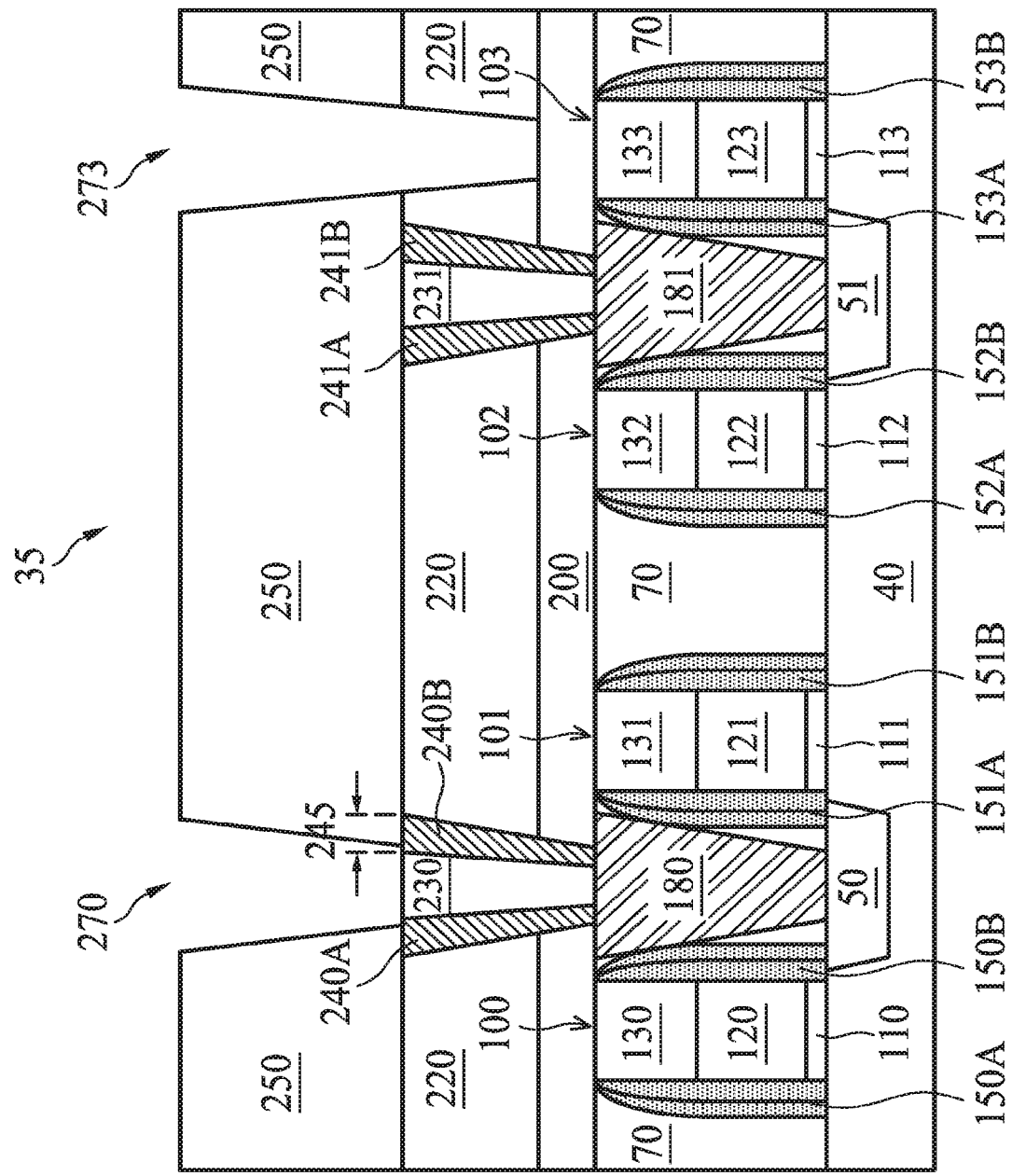
FIGS. 1-4 and 6 are cross-sectional side views of a semiconductor device at various stages of fabrication according to various embodiments of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As semiconductor fabrication technology nodes progress to smaller generations, more transistors can be implemented on a single IC chip. This improves the performance of the IC chips while reducing their cost. However, traditional semiconductor fabrication methods may still have shortcomings. For example, the fabrication of semiconductor devices involves forming an interconnect structure to provide electrical connectivity to the various components of the semiconductor devices (e.g., gate, source, drain). Among other things, the interconnect structure may include conductive vias/contacts that are formed to be electrically connected to the semiconductor devices. The vias/contacts are typically formed by etching a via/contact hole in an electrically insulating layer, and then filling the via/contact hole with an electrically conductive material. As semiconductor device sizes continue to get scaled down, the etching of the via/contact hole (e.g., etching open a hard mask over a gate) may inadvertently puncture other layers that have the same or similar material compositions as the hard mask. These inadvertently punctured layers may then create a leakage path that becomes electrically conductive when it is filled by a conductive material (as a result of a deposition process to form vias/contacts). Such a conductive leakage path may lead to undesirable electrical shorting (e.g., shorting between the gates of semiconductor device and other vias/contacts), which leads to degraded device performance or device failures.

To overcome the problems discussed above, the present disclosure forms a protective layer on sidewalls of via/contact holes. This protective layer prevents the inadvertent etching of layers and thus reduces the likelihood of forming the leakage path that would have led to electrical shorting.

The various aspects of the present disclosure are discussed in more detail below with reference to FIGS. 1-5 and 7-8.

FIGS. 1-6 are simplified diagrammatic cross-sectional side views of a semiconductor device 35 during various fabrication stages. The semiconductor device 35 may be a part of an integrated circuit (IC) chip, system on chip (SoC), or portion thereof. It may include various passive and active microelectronic devices such as resistors, capacitors, inductors, diodes, metal-oxide semiconductor field effect transistors (MOSFET), complementary metal-oxide semiconductor (CMOS) transistors, laterally diffused MOS (LDMOS) transistors, high power MOS transistors, or other types of transistors. It is understood that FIGS. 1-6 have been simplified for a better understanding of the inventive concepts of the present disclosure. Accordingly, it should be noted that additional processes may be provided before, during, and after the processes shown in FIGS. 1-6 to complete the fabrication of the semiconductor device 35, and that some other processes may only be briefly described herein.

Referring to FIG. 1, a semiconductor device 35 includes a substrate 40. The substrate 40 may be a silicon substrate doped with a P-type dopant such as boron (for example a P-type substrate). Alternatively, the substrate 40 could be another suitable semiconductor material. For example, the substrate 40 may be a silicon substrate that is doped with an N-type dopant such as phosphorous or arsenic (an N-type substrate). The substrate 40 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In some embodiments, the substrate 40 could include an epitaxial layer (epi layer), may be strained for performance enhancement, and may include a silicon-on-insulator (SOI) structure.

The illustrated portion of the substrate 40 may be an active region (OD). A plurality of source/drain regions—for example source/drain regions 50-51—may be formed in the active region. The source/drain regions 50-51 may serve as the source/drain components of transistors, such as a FinFET transistor.

An interlayer dielectric (ILD) 70 is formed over the substrate 40. In some embodiments, the ILD 70 comprises silicon oxide ($SiO_2$). The ILD 70 may be formed by a suitable deposition process followed by a polishing process such as chemical-mechanical-polishing (CMP), so as to planarize the upper surface of the ILD 70. The ILD 70 may also be referred to as an ILD0 layer.

A plurality of gate structures, for example gate structures 100-103, is formed over the substrate 40. The gate structures 100-103 include gate dielectric layers 110-113. The gate dielectric layers 110-113 may be formed by a suitable deposition process, for example atomic layer deposition (ALD), chemical vapor deposition (CVD), or physical vapor deposition (PVD), etc. In some embodiments, the gate dielectric layer 60 includes a high-k dielectric material. A high-k dielectric material is a material having a dielectric constant that is greater than a dielectric constant of $SiO_2$, which is approximately 4. In an embodiment, the gate dielectric layer 60 includes hafnium oxide ($HfO_2$), which has a dielectric constant that is in a range from approximately 18 to approximately 40. In alternative embodiments, the gate dielectric layer 60 may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO.

The gate structures 100-103 include gate electrode layers 120-123. The gate electrode layers 120-123 are located over the gate dielectric layers 110-113, respectively. In some embodiments, the gate electrode layers 120-123 include metal gate electrodes. The metal gate electrodes may include a work function metal component and a fill metal component. The work function metal component is configured to tune a work function of its corresponding FinFET to achieve a desired threshold voltage Vt. In various embodiments, the work function metal component may contain: TiAl, TiAlN, TaCN, TiN, WN, or W, or combinations thereof. The fill metal component is configured to serve as the main conductive portion of the functional gate structures 100-103. In various embodiments, the fill metal component may contain Aluminum (Al), Tungsten (W), Copper (Cu), or combinations thereof.

The gate structures 100-103 include hard masks 130-133. The hard masks 130-133 are located over the gate electrode layers 120-123, respectively. The hard masks 130-133 are formed by a patterning process and may include a dielectric material. In some embodiments, the hard masks 130-133 comprise silicon nitride ($Si_3N_4$). In some other embodiments, the hard masks 130-133 comprise a layer of silicon nitride and a layer of silicon oxide.

In some embodiments, the gate structures 100-103 may be formed by a gate replacement process, in which dummy gate structures are replaced by the gate structures 100-103. For example, the dummy gate structures may each include a polysilicon dummy gate electrode. After the formation of source/drain regions 50-51, the dummy gate electrodes are removed, and the gate electrodes 120-123 are formed in place of the dummy gate electrodes. In some other embodiments, the gate replacement process may also involve forming a dummy gate dielectric layer for each of the gate structures. The dummy gate dielectric layers may include silicon oxide. The dummy gate dielectric layers may also be replaced (along with the dummy gate electrode layers) by the gate dielectric layers 110-113 (e.g., containing a high-k dielectric material).

A plurality of gate spacers is formed on sidewalls of the gate structures 100-103. For example, gate spacers 150A-150A are formed on opposite sidewalls of the gate structure 100, gate spacers 151A-151A are formed on opposite sidewalls of the gate structure 101, gate spacers 152A-152A are formed on opposite sidewalls of the gate structure 102, and gate spacers 153A-153A are formed on opposite sidewalls of the gate structure 103. The gate spacers 150A-153A and 150B-153B include a dielectric material. In some embodiments, the gate spacers 150A-153A and 150B-153B include silicon nitride ($Si_3N_4$), which is the same material as the hard masks 130-133.

A plurality of vias is formed over the substrate 40 and to provide electrical connectivity to the source/drain regions 50-51. For example, a via 180 is formed over the source/drain region 50 (and between the gate structures 100-101), and a via 181 is formed over the source/drain region 51 (and between the gate structures 102-103). The vias 180-181 vertically extend through the ILD 70. For example, the vias 180-181 may be formed by etching openings (via holes) in the ILD 70 and subsequently filling the openings with a conductive material. The conductive material may comprise tungsten, copper, aluminum, or combinations thereof.

An etching-stop layer 200 is formed over the ILD 70, over the gate structures 100-103, and over the vias 180-181. The etching-stop layer 200 is formed to serve as an etching-stop layer for double patterning. The etching-stop layer 200 comprises a dielectric material. In some embodiments, the dielectric material is silicon nitride (Si$_3$N$_4$), which is the same material as the hard masks 130-133.

An interlayer dielectric (ILD) 220 is formed over the etching-stop layer 200. In some embodiments, the ILD 220 comprises silicon oxide (SiO$_2$). The ILD 220 may be formed by a suitable deposition process followed by a polishing process such as CMP, so as to planarize the upper surface of the ILD 220. The ILD 220 may also be referred to as an ILD1 layer.

Conductive vias 230-231 are formed over the vias 180-181, respectively, to provide electrical connectivity to the vias 180-181 (and thus the source/drain regions 50-51). The vias 230-231 vertically extend through the ILD 220. For example, the vias 230-231 may be formed by etching openings (via holes) in the ILD 220 and subsequently filling the openings with a conductive material. The conductive material may include tungsten, copper, aluminum, or combinations thereof. In the illustrated embodiment, the sidewalls of via 230 are in direct physical contact with spacers 240A-240B, and the sidewalls of via 231 are in direct physical contact with spacers 241A-241B. The spacers 240A-240B and 241A-241B may be formed first, and then the vias 230-231 are formed later. The spacers 240A-240B and 241A-241B comprise a dielectric material. In some embodiments, the dielectric material is silicon nitride (Si$_3$N$_4$), which is the same material as the hard masks 130-133 and the etching-stop layer 200. The Spacers 240A-240B and 241A-241B each have a thickness 245. In some embodiments, the thickness 245 is in a range from 0.5 microns to 100 microns.

Another interlayer dielectric (ILD) 250 is formed over the ILD 220 and over the vias 230-231. In some embodiments, the ILD 250 comprises silicon oxide (SiO$_2$). The ILD 250 may be formed by a suitable deposition process followed by a polishing process such as CMP, so as to planarize the upper surface of the ILD 250. The ILD 250 may also be referred to as an ILD2 layer.

Via holes 270 and 273 are then formed as a part of forming the vias to provide electrical connectivity to the via 230 and the gate structure 103. In more detail, using an etching process, the via hole 273 is etched into the ILD 250 and 220 (extends vertically through the ILD 250 and 220) until the etching-stop layer 200 is reached, due to the etching selectivity between the silicon oxide material of the ILDs 250/220 and the silicon nitride material of the etching-stop layer 200.

By way of the same etching process that forms the via hole 273, the via hole 270 is etched into the ILD 250 (and extends vertically through the ILD 250) until the via 230 is exposed, due to the etching selectivity between the silicon oxide material of the ILD 250 and the conductive material of the via 230. The via holes 270 and 273 are filled with a conductive material later to form conductive vias therein.

It is understood that, due to processing constraints, the via hole 270 may not be perfectly aligned with the via 230. If the via hole 270 is shifted (e.g., to the left or right laterally), a portion of the upper surface of the spacers 240A-240B may become exposed by the via hole 270. Alternatively, even if the alignment between the via hole 270 and the via 230 is perfect, the via hole 270 may still be formed to be wider than the upper surface of the via 230, which would also expose a portion of the upper surface of the spacer 240A or 240B. This unintentional exposure of the spacers 240A-240B (by the via hole 270) may lead to the formation of a leakage path when an etching process is performed later. To combat this problem, the present disclosure reduces the likelihood of exposing the spacers 240A-240B, as discussed below in more detail.

Figure 2:
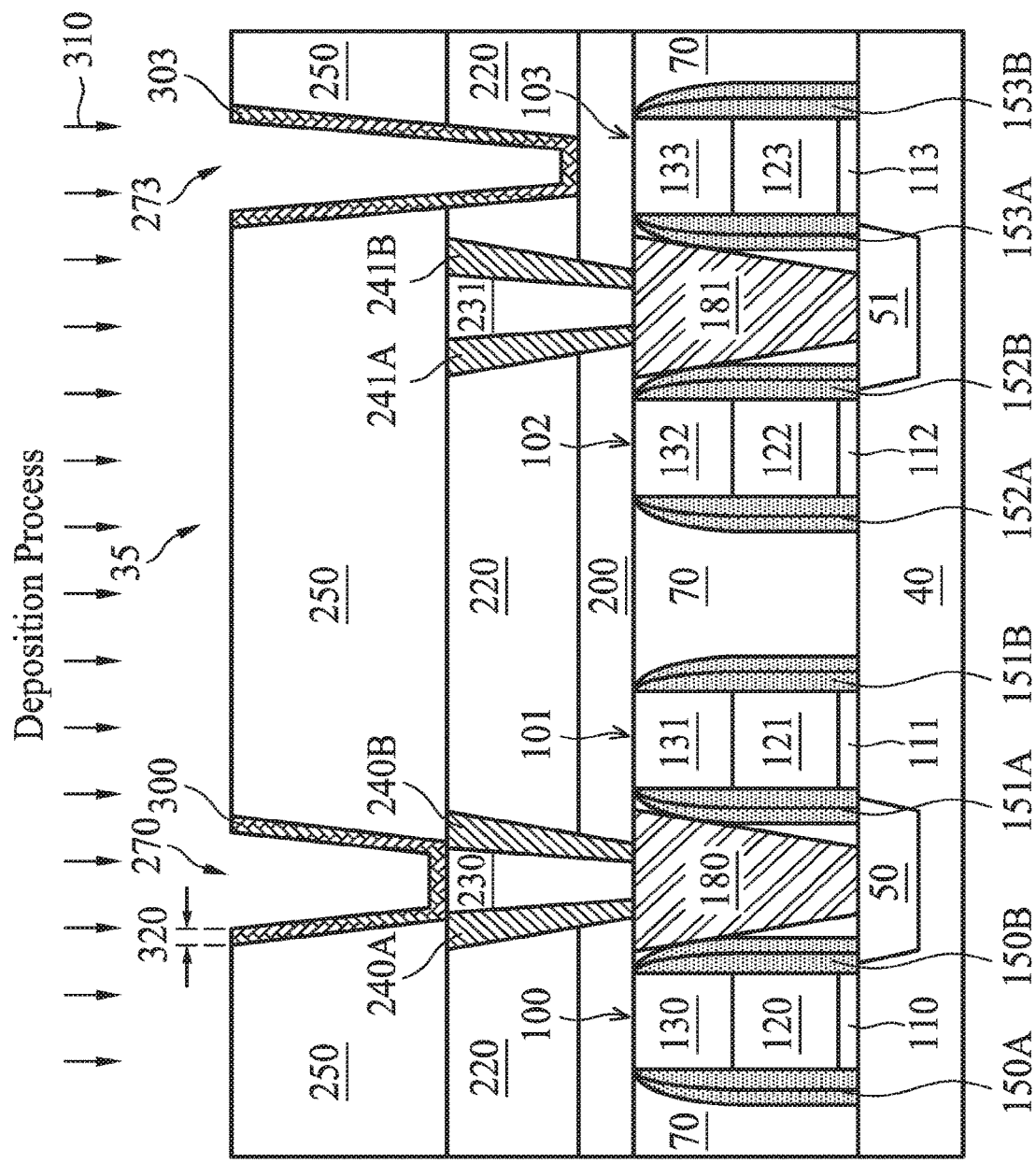

Referring now to FIG. 2, a protective layer 300 is formed in the via hole 270, and a protective layer 303 is formed in the via hole 273. The formation of the protective layer 300 is one of the novel aspects of the present disclosure that is not performed in conventional semiconductor fabrication processes. The protective layers 300 and 303 help prevent the inadvertent puncturing of various elements during the via-etching processes to be performed later (discussed below in more detail). In other words, the protective layers 300-303 reduce the likelihood of inadvertently creating a leakage path that would cause undesirable electrical shorting problems later. Among other things, the protective layer 300 may help cover up the spacers 240A-240B even if the via hole 270 is laterally shifted with respect to the via 230. This helps prevent the unintentional etching of the spacers 240A-240B. The functionality of the protective layers 300-303 will be discussed in more detail below with reference to FIGS. 3-4.

To adequately serve their protective functions, the protective layers 300-303 have a material composition such that they have sufficient etching selectivity with the materials of the spacers 240A-240B, the etching-stop layer 200, and the hard masks 130-133. In the illustrated embodiment, this means that the protective layers 300-303 have etching selectivity with silicon nitride. This means that the protective layers 300-303 and silicon nitride would have substantially different etching rates in an etching process. In some embodiments, the silicon nitride would be etched away at a significantly higher rate (e.g., 10 times or 20 times higher) than the protective layers 300-303. As an example, the protective layers 300-303 comprise a polymer material. In various embodiments, the polymer material may comprise methane, such as CH$_4$, or it may comprise a methylene or a methylene bridge, such as $-(CH_2-)_n$. In alternative embodiments, the protective layers 300-303 may comprise another suitable material having sufficiently high etching selectivity with respect to the material of the spacers 240A-240B and the hard masks 130-133 (e.g., having high etching selectivity with respect to silicon nitride).

The protective layers 300-303 may be formed using a deposition process 310. In some embodiments, the deposition process 310 is performed in a deposition chamber with a CH$_4$ precursor. The deposition chamber may be filled with a plasma (with action anions). The deposition process 310 may have a pressure between 2 milli-Torrs (m-Torr) and 8 m-Torr, for example 5 m-Torr. The deposition process 310 may use a Thermo-Chromatographic Pulse (TCP) Radio-Frequency (RF) power between 400 watts (W) 800 W, for example 600 W. The deposition process 310 may have a process time (or duration) between 10 seconds and 30 seconds, for example 19 seconds. The deposition process 310 may have a temperature between 40 degrees Celsius and 60 degrees Celsius.

The protective layer 300 is formed to have a thickness 320. In some embodiments, the thickness 320 is in a range between 4 nanometers (nm) and 6 nm. The thickness range is configured such that, even after a bottom segment of the protective layer 300 is removed (in a polymer "breakthrough" process to be performed subsequently), the remaining portions of the protective layer 300 can still adequately cover up any potentially exposed portions of the spacers 240A or 240B.

Figure 3:
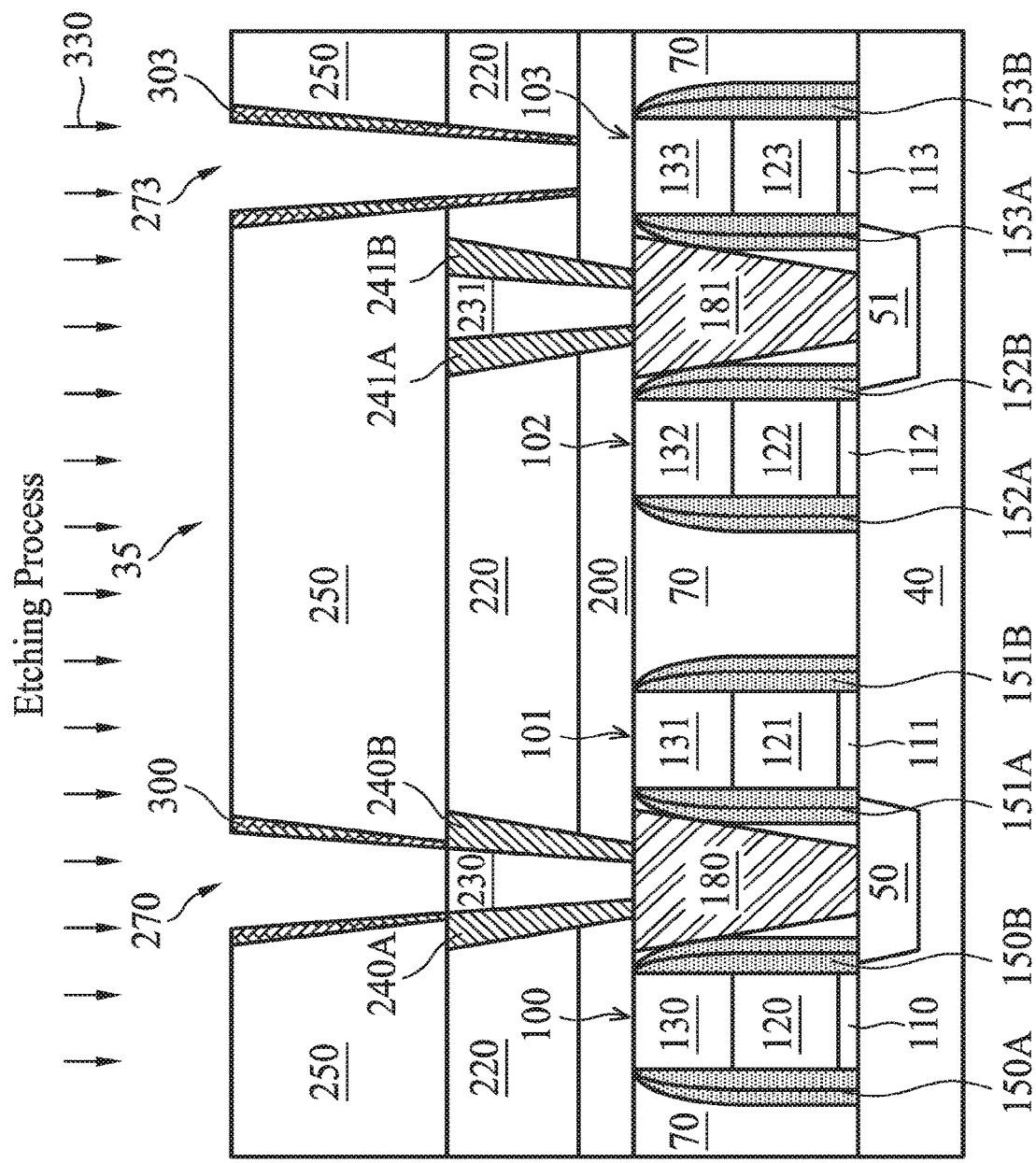

Referring now to FIG. 3, an etching process 330 is performed to "break through" the protective layers 300 and 303. As shown in FIG. 3, the bottom segments (segments overlying the via 230 and the etching-stop layer 200) of the protective layers 300-303 are removed by the etching process 330. The removal of the bottom segments of the protective layers 300-303 exposes the etching-stop layer 200 (and also exposes the via 230). The exposure of the etching-stop layer 200 allows one or more subsequent etching processes to be performed to etch through the etching-stop layer 200 and through the hard mask 133, so that the gate electrode 123 can be exposed. Meanwhile, the side segments (disposed on the sidewalls of the ILDs 250 and 220) of the protective layers 300 and 303 still remain after the etching process 330 is performed, so they can still serve their protective functions in the subsequent etching processes.

Figure 4:
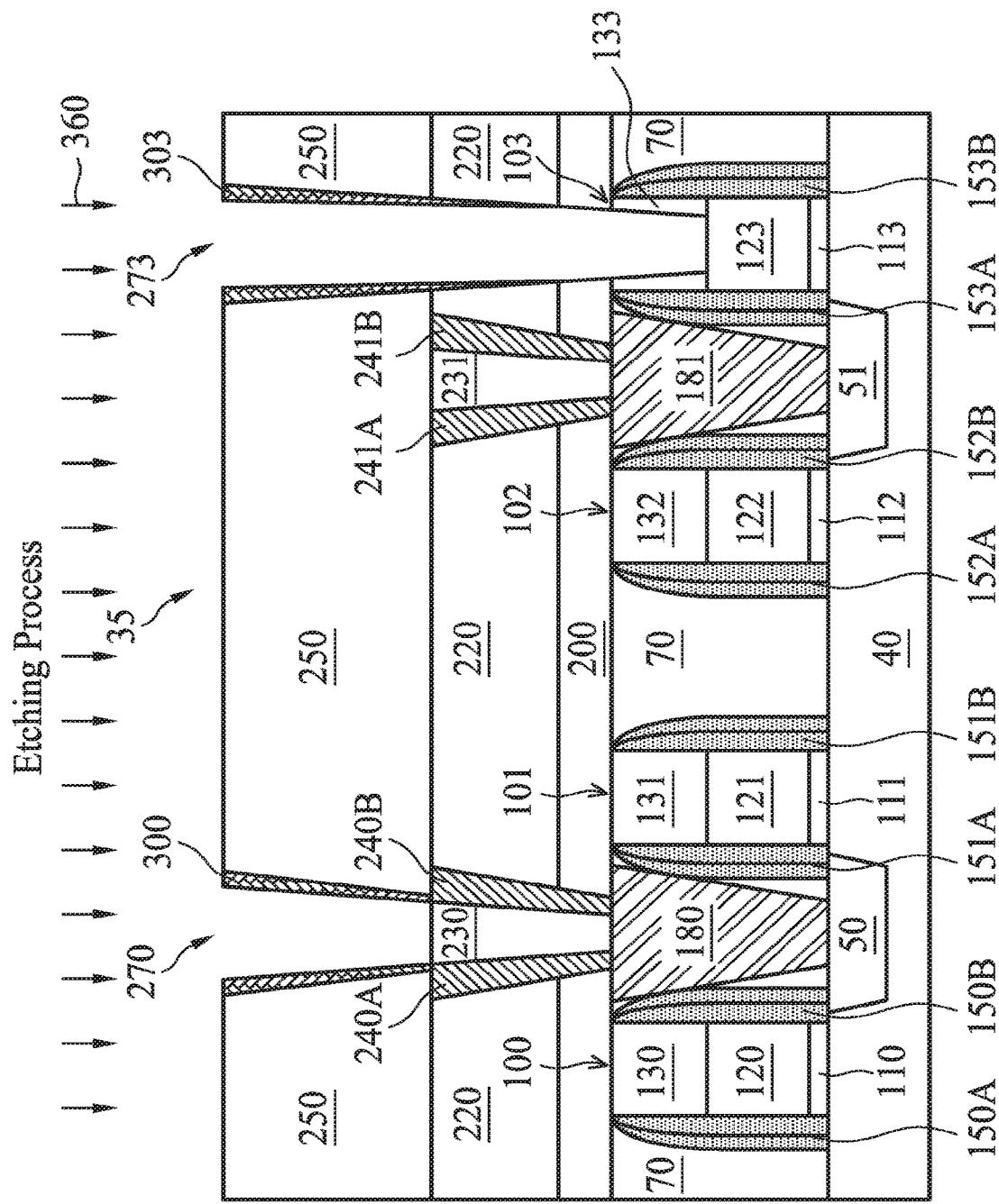

Referring now to FIG. 4, an etching process 360 is performed to extend the via hole 273 further downward through the etching-stop layer 200 and through the hard mask 133. The etching process 360 is configured such that it etches away silicon nitride (the material composition of the etching-stop layer 200 and the hard mask 133) without substantially etching away the protective layer 300-303. Thus, the gate electrode 123 is exposed as a result of the etching process 360.

Figure 5:
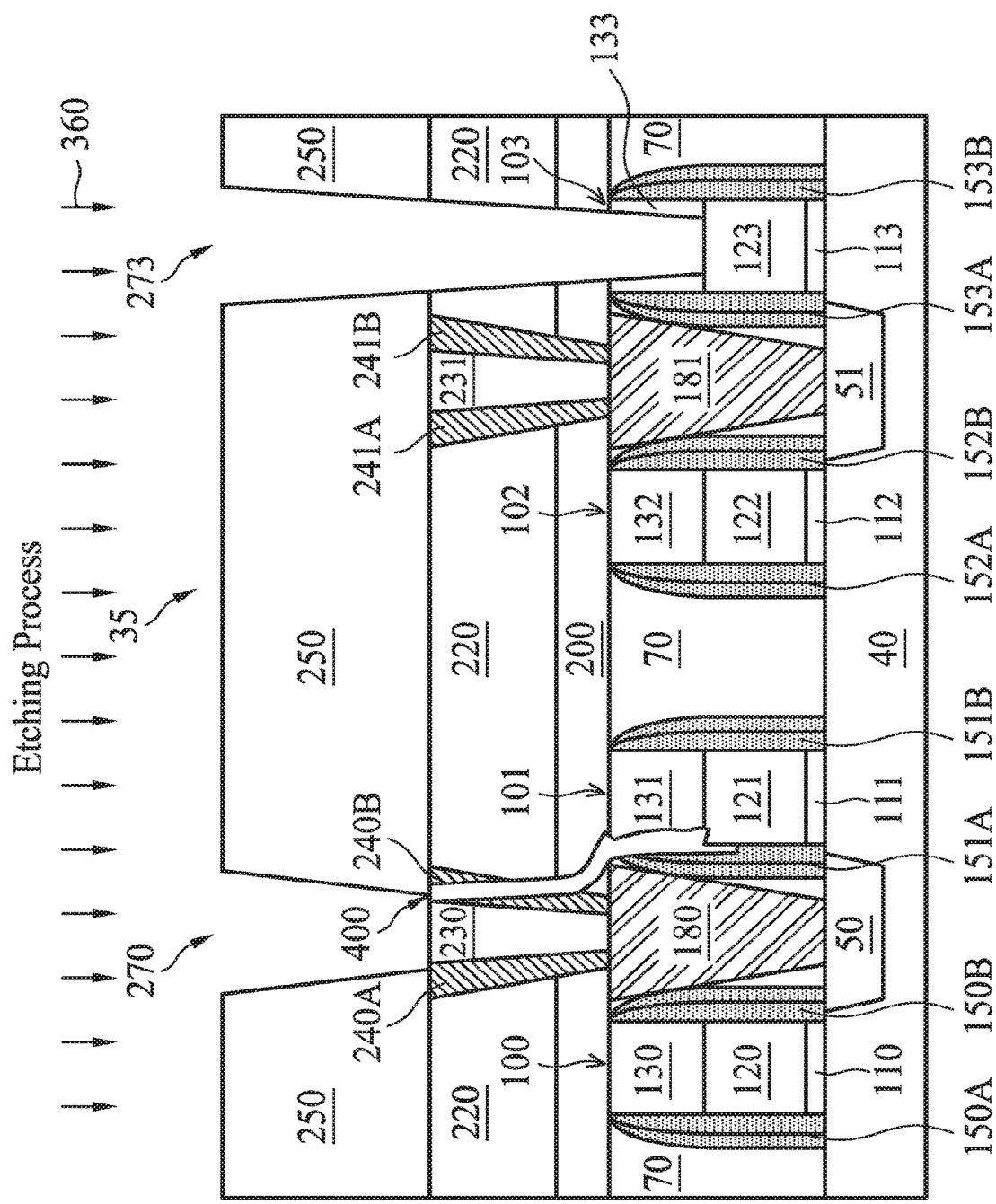
FIG. 5 is a cross-sectional side views of a semiconductor device showing the formation of a leakage path.

As discussed above, the protection offered by the protective layer 300 is important, because it prevents the formation of undesirable leakage paths. In more detail, had the protective layer 300 not been formed, a leakage path could have been inadvertently formed by the etching process 360. This is illustrated in FIG. 5, where an example leakage path 400 could have been formed as a result of the etching process 360, had the protective layer 300 not been formed.

For example, as discussed above, the via hole 270 may unintentionally expose a portion of the spacer 240A or the spacer 240B. Since the material composition is silicon nitride for the spacers 240A-240B, the etching-stop layer 200, and the hard masks 130-133, it means that the "opening" of the hard mask 133—by way of the etching process 360—to expose the gate electrode 123 can also unintentionally etch away the spacers 240A or 240B if they are exposed by the via hole 270. In the illustrated example, a portion of the spacer 240B is etched away (due to being exposed by the via hole 270) during the etching process 360, along with portions of the etching-stop layer 200, the hard mask 131, and possibly the spacer 151A. Consequently, parts of the gate electrode 121 become exposed. When a deposition process is performed later to fill the via holes 270 and 273 with a conductive material, the conductive material would also fill the leakage path 400. As such, the gate electrode 121 would become electrically connected coupled to the via 230 through the conductive material filling the leakage path 400. Stated differently, the gate electrode 121 would be electrically shorted to the via 230, which could create unforeseen problems and may cause the IC to malfunction or even suffer a failure.

Returning back to FIG. 4, the present disclosure addresses this problem by forming the protective layer 300 to cover up the potentially exposed portions of the spacers 240A-240B. As the etching process 360 is performed to etch the via hole 273 further downward (until the gate electrode 123 is exposed), the protective layer 300 protects the spacers 240A-240B underneath from being etched. As discussed above, this is due to the etching selectivity between the protective layer 300 (with a polymer material composition) and the spacers 240A-240B (with a silicon nitride material composition). Hence, no leakage path (e.g., a leakage path similar to the leakage path 400 discussed above with reference to FIG. 5) is likely to be formed. Consequently, electrical shorting between the via 230 and the gate electrodes 120-121 will not occur.

Figure 6:
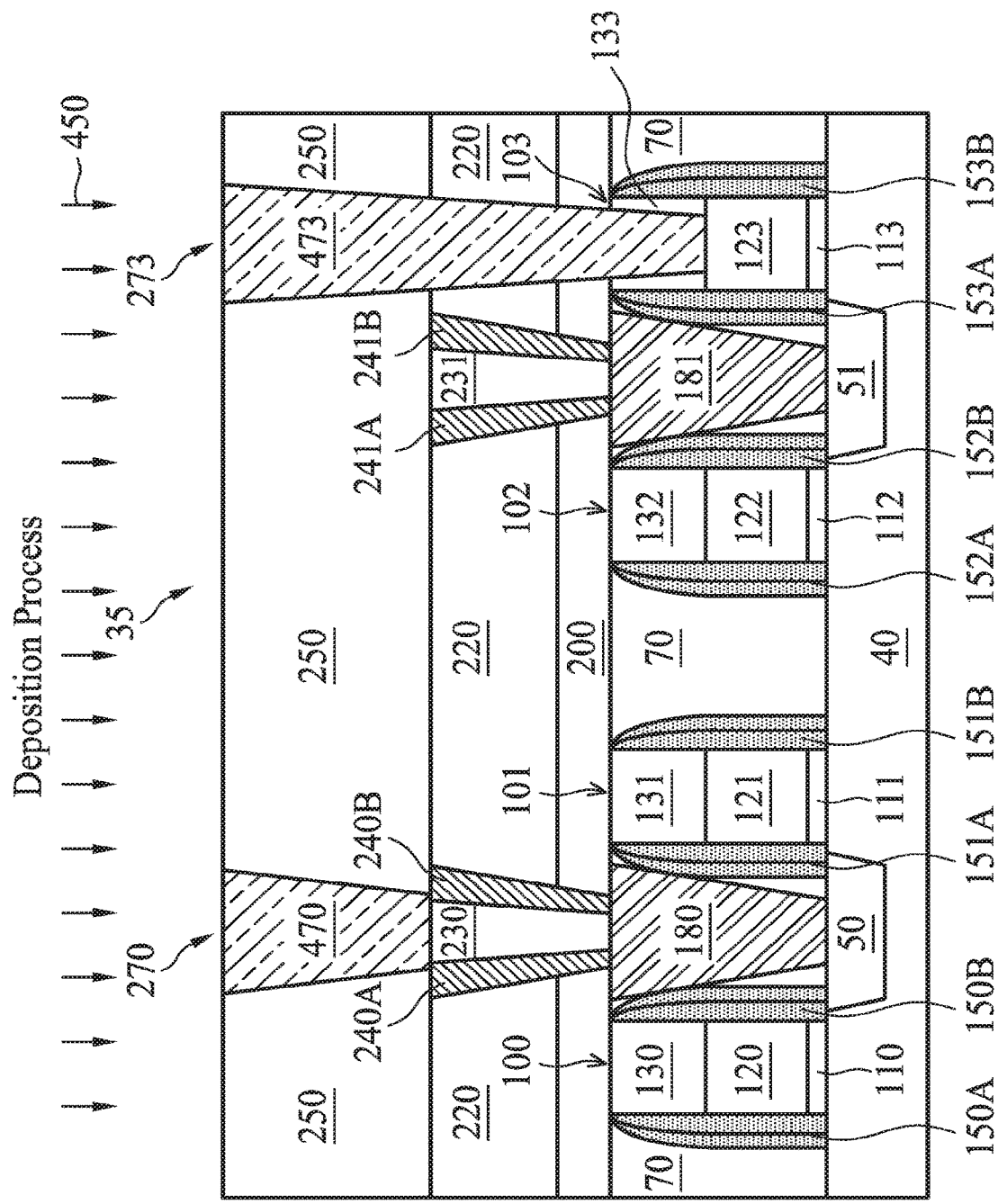

Referring now to FIG. 6, the protective layers 300-303 are removed. The removal of the protective layers 300-303 may be performed using oxygen and/or hydrogen plasma, for example. Thereafter, a deposition process 450 is then performed to fill the via holes 270 and 273 to form conductive vias 470 and 473 therein. The via 470 is electrically coupled to the via 230 and 180, and as such provides electrical connectivity to the source/drain region 50 through the vias 230 and 180. The via 473 is electrically coupled to the gate electrode 123. Again, had the protective layer 300 not been formed, the vias 230 and 470 could be electrically shorted to the gate electrodes 120 or 121. This would create an electrical shorting between the gates 100/101 and the source/drain region 50, which would interfere with the intended operation of the transistors. The formation of the protective layer 300 prevents this potential device defect from occurring and thus improves the quality and integrity of the semiconductor device 35.

It is understood that the processes discussed above may be applied to a FinFET device as the semiconductor device 35. The use of FinFET devices has been gaining popularity in the semiconductor industry. A FinFET device is a fin-like field-effect transistor device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device.

Figure 7:
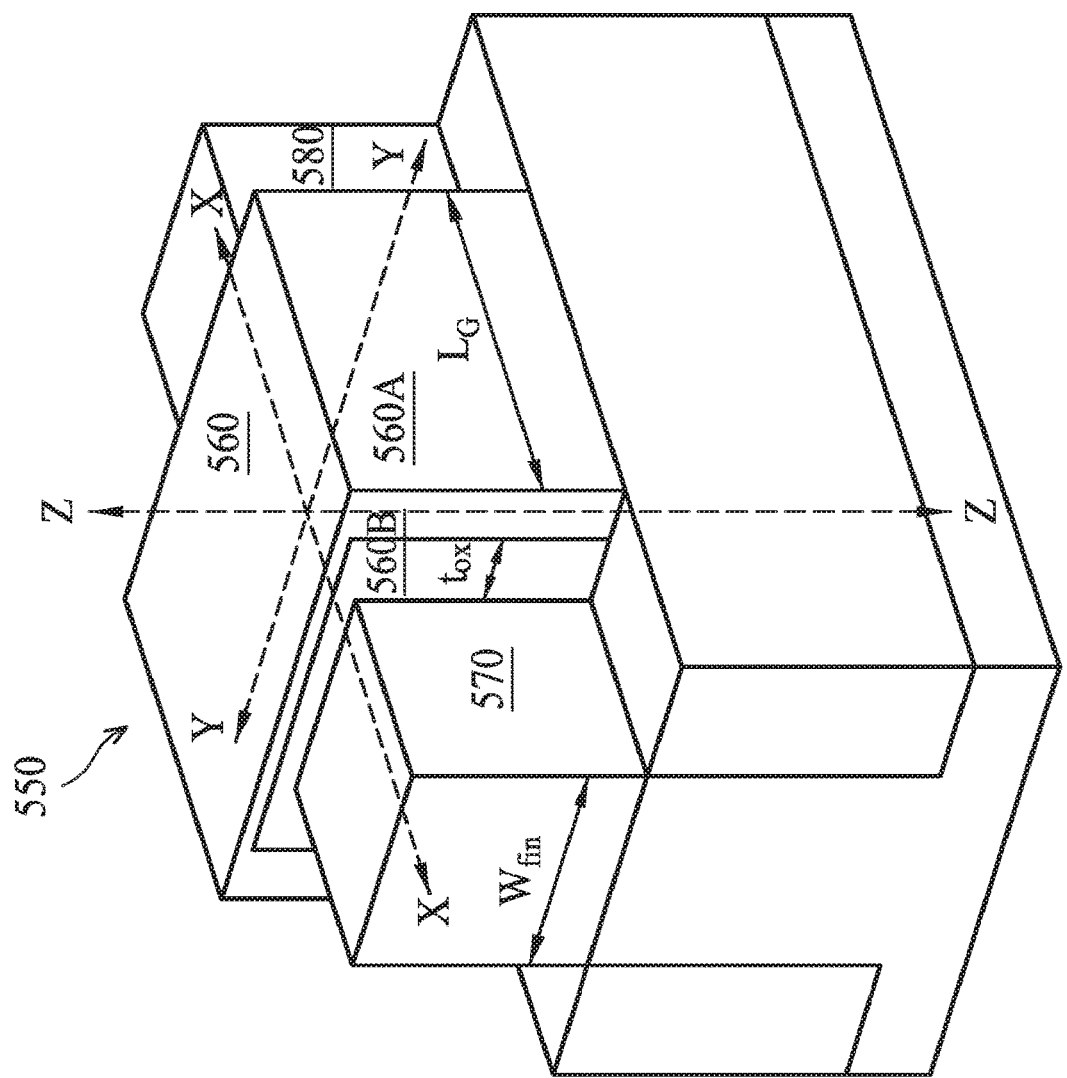
FIG. 7 is a perspective three-dimensional view of a FinFET transistor.

Referring to FIG. 7, a perspective view of an example FinFET device 550 is illustrated. The FinFET device 550 is a non-planar multi-gate transistor that is built over a substrate (such as a bulk substrate). A thin silicon "fin-like" structure (referred to as fin) forms the body of the FinFET device 550. The fin has a fin width $W_{fin}$. A gate 560 of the FinFET device 550 is wrapped around this fin. Lg denotes a length (or width, depending on the perspective) of the gate 560. The gate 560 may include a gate electrode component 560A and a gate dielectric component 560B. The gate dielectric 560B has a thickness $t_{ox}$. A portion of the gate 560 is located over a dielectric isolation structure such as shallow trench isolation (STI). A source 570 and a drain 580 of the FinFET device 550 are formed in extensions of the fin on opposite sides of the gate 560. The fin itself serves as a channel. The effective channel length of the FinFET device 550 is determined by the dimensions of the fin.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip. Nevertheless, it is understood that the processes of the present disclosure discussed above may apply to non-FinFET devices too, for example a traditional planar device.

Figure 8:
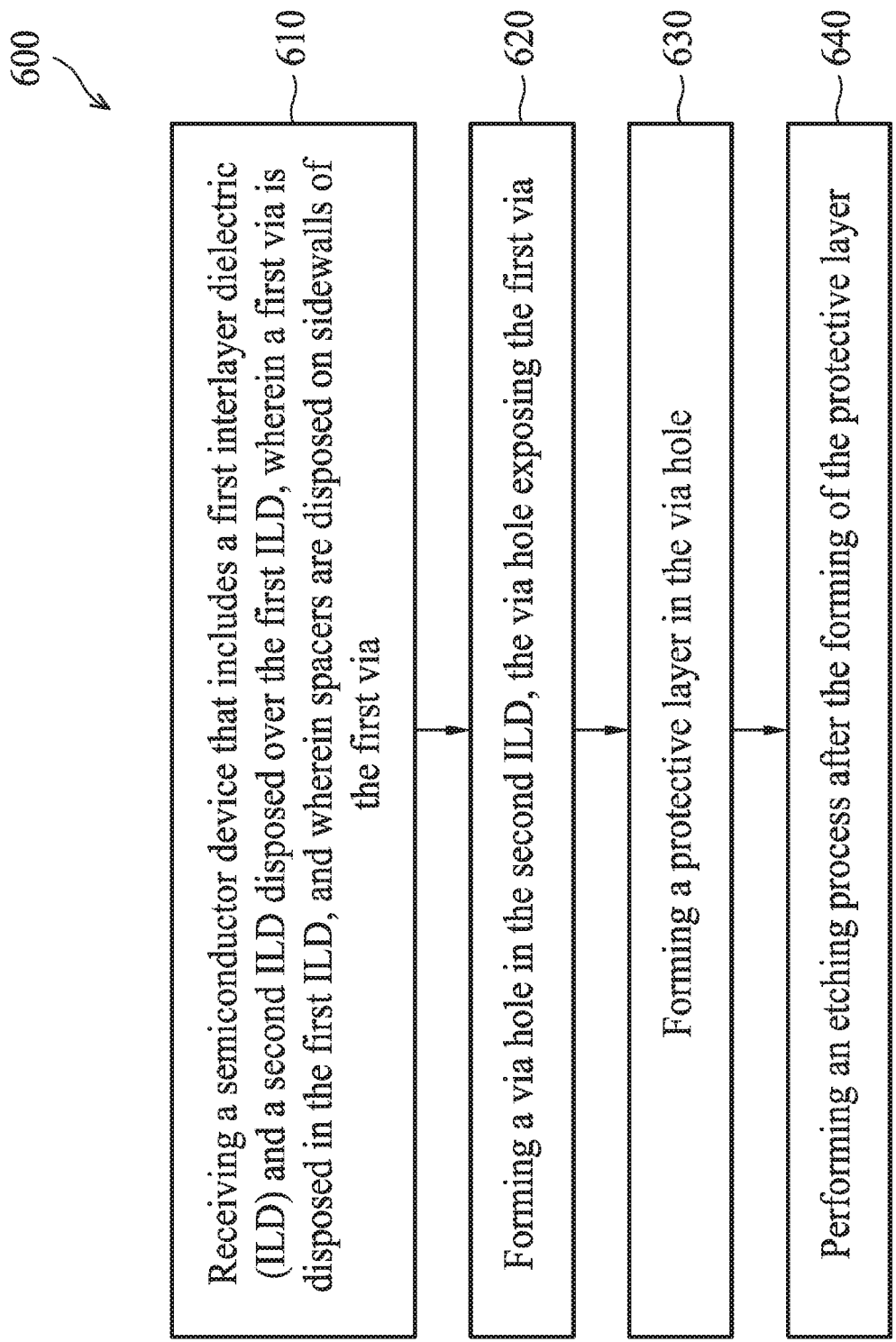
FIG. 8 is a flow chart of a method for fabricating a semiconductor device in accordance with embodiments of the present disclosure.

FIG. 8 is a flowchart of a method 600 for fabricating a semiconductor device in accordance with various aspects of the present disclosure. The method 600 includes a step 610 of receiving a semiconductor device that includes a first interlayer dielectric (ILD) and a second ILD disposed over the first ILD. A first via is disposed in the first ILD, and wherein spacers are disposed on sidewalls of the first via. In some embodiments, the spacers have a first material composition, and the first ILD or the second ILD has a second material composition different from the first material composition.

The method 600 includes a step 620 of forming a via hole in the second ILD. The via hole exposes the first via.

The method 600 includes a step 630 of forming a protective layer in the via hole. In some embodiments, the forming of the protective layer comprises forming the protective layer that comprises a material different from the first dielectric material.

The method 600 includes a step 640 of performing an etching process after the forming of the protective layer. In some embodiments, the etching process is configured to etch away a first dielectric material, and the spacers comprise the first dielectric material. In some embodiments, the material of the protective layer has an etching selectivity with the first dielectric material during the etching process. In some embodiments, the first dielectric material comprises silicon nitride, and the material of the protective layer comprises a polymer.

In some embodiments, the semiconductor device further comprises a gate disposed below the first ILD. The gate includes a gate electrode and a hard mask disposed over the gate electrode, and the etching process removes a portion of the hard mask to expose the gate electrode. In some embodiments, the hard mask and the spacers have the same material composition.

It is understood that additional steps may be performed before, during, or after the steps 610-640. For example, the method 600 may include a step of: before the etching process, removing a bottom segment of the protective layer. Before the forming of the protective layer, a first portion of the spacers is exposed by the via hole. After the removing of the bottom segment, a remaining portion of the protective layer still covers up the first portion of the spacers. In some embodiments, the remaining portion of the protective layer protects the first portion of the spacers from being etched in the etching process. As another example, the method 600 may include a step of removing the protective via, and then forming a second conductive via in the via hole.

Based on the above discussions, it can be seen that the present disclosure offers advantages over conventional semiconductor device fabrication. It is understood, however, that other embodiments may offer additional advantages, and not all advantages are necessarily disclosed herein, and that no particular advantage is required for all embodiments. One advantage is that by forming a protective layer in the via hole as discussed above, the present disclosure prevents the formation of leakage paths that could cause electrical shorting. The protective layer covers up spacers around the via that could otherwise be exposed by the via hole. Since the spacers and the hard masks have the same material composition (e.g., silicon nitride), the etching process performed to open up the hard mask (as a part of forming a via to provide electrical connectivity to the gate electrode) could also inadvertently etch away the inadvertently exposed spacers, which could form a leakage path between the via and a gate electrode below. When a subsequently deposition process is performed to fill the via hole, the gate electrode could be electrically shorted to the via. Here, the presence of the protective layer substantially reduces this risk, since the protective layer has a high etching selectivity with respect to the spacers and the hard masks during the etching process. Thus, the protective layer can prevent unintentional etching of the spacers during the etching process, thereby reducing the likelihood of creating an electrical shorting situation between the via and the gate electrode. Other advantages include compatibility with existing processing steps and the ease of implementation. Therefore, implementing the present disclosure will not significantly increase fabrication costs.

One aspect of the present disclosure involves a method of fabricating a semiconductor device. A semiconductor device is received. The semiconductor device includes a first interlayer dielectric (ILD) and a second ILD disposed over the first ILD. A first via is disposed in the first ILD, and spacers are disposed on sidewalls of the first via. A via hole is formed in the second ILD. The via hole exposes the first via. A protective layer is formed in the via hole. An etching process is performed after the forming of the protective layer.

Another aspect of the present disclosure involves a method of fabricating a semiconductor device. A gate structure is formed over a substrate. The gate structure includes a gate electrode and a hard mask located over the gate electrode. The hard mask comprises a first dielectric material. A first interlayer dielectric (ILD) is formed over the gate structure. The first ILD comprises a second dielectric material different from the first dielectric material. A first via is formed in the first ILD. Sidewalls of the first via are surrounded by spacers that comprise the first dielectric material. A second ILD is formed over the first ILD. A via hole is formed in the second ILD. The via hole exposes the first via. A protective layer is formed in the via hole. A bottom segment of the protective layer is removed. Thereafter, an etching process is performed. A remaining segment of the protective layer prevents an etching of the spacers during the etching process.

Yet another aspect of the present disclosure involves a method of fabricating a semiconductor device. A gate structure is formed over a substrate. The gate structure includes a gate electrode and a hard mask located over the gate electrode. The hard mask comprises silicon nitride. A first interlayer dielectric (ILD) is formed over the gate structure. The first ILD comprises silicon oxide. A first via is formed in the first ILD. Sidewalls of the first via are surrounded by spacers that comprise silicon nitride. A second ILD is formed over the first ILD. The second ILD comprises silicon nitride. A via hole is formed in the second ILD. The via hole exposes the via and exposes a first portion of the spacers. A protective layer is formed in the via hole. The protective layer comprises a polymer. A bottom segment of the protective layer is removed. A remaining segment of the protective layer still covers the first portion of the spacers. An etching process is performed to remove a portion of the hard mask so that a portion of the gate electrode becomes exposed. The polymer has an etching selectivity with the silicon nitride such that the remaining segment of the protective layer prevents the spacers from being inadvertently etched during the etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
   forming a first via in a first interlayer dielectric (ILD);
   forming a second ILD over the first via and the first ILD;
   etching an opening in the second ILD, the opening at least partially exposing an upper surface of the first via; and
   forming a polymer-containing layer as a protective layer in the opening, wherein the protective layer is formed on the exposed upper surface of the first via and on side surfaces of the opening, and wherein the etching the opening and the forming the protective layer are performed such that a bottom surface of the protective layer is wider than the upper surface of the first via.

2. The method of claim 1, further comprising: forming spacers on sidewalls of the first via.

3. The method of claim 2, wherein the forming the protective layer is performed such that the protective layer has a different material composition than the spacers.

4. The method of claim 1, wherein the protective layer is formed to have a thickness in a range between about 4 nanometers (nm) and about 6 nm.

5. The method of claim 1, wherein:
   the first ILD is formed over an etching-stop layer (ESL); and
   the first via extends vertically through both the ESL and the first ILD.

6. The method of claim 1, further comprising: performing a first etching process to remove a portion of the protective layer covering the upper surface of the first via.

7. The method of claim 6, further comprising: after the first etching process is performed, performing a second etching process, wherein at least portions of the protective layer covering the side surfaces of the opening remain after the second etching process has been performed.

8. The method of claim 7, further comprising, after the second etching process has been performed:
   removing the protective layer; and
   forming a second via in the opening, wherein the second via is formed to be in electrical contact with the first via.

9. A method of fabricating a semiconductor device, comprising:
   forming a source/drain in a substrate and a gate structure over the substrate;
   forming a first via over the source/drain;
   forming a first interlayer dielectric (ILD) over the first via and over the gate structure;
   forming a second via over the first via;
   forming a second ILD over the first ILD and over the second via;
   forming a first recess that extends vertically through the second ILD and forming a second recess that extends vertically through the second ILD and the first ILD, wherein the first recess at least partially exposes an upper surface of the second via, and wherein the second recess is aligned with the gate structure;
   forming a first protective layer in the first recess and forming a second protective layer in the second recess;
   performing a first etching process to remove a bottom segment of the first protective layer and a bottom segment of the second protective layer; and
   performing a second etching process to vertically extend the second recess until an upper surface of the gate structure is exposed.

10. The method of claim 9, further comprising, after the performing of the second etching process:
    removing the first protective layer and the second protective layer; and
    filling the first recess and the second recess with a conductive material.

11. The method of claim 9, wherein:
    dielectric spacers are disposed on sidewalls of the second via;
    the first recess is formed such that the dielectric spacers are at least partially exposed; and
    the first protective layer is formed to cover up exposed portions of the dielectric spacers.

12. The method of claim 11, wherein the second etching process is configured to have an etching selectivity between the first protective layer and the dielectric spacers.

13. The method of claim 11, further comprising: forming an etching-stop layer (ESL) over the first via and over the gate structure, wherein the first ILD is formed over the ESL, and wherein the ESL and the dielectric spacers have substantially identical material compositions.

14. The method of claim 9, wherein the first protective layer and the second protective layer are formed to include a polymer material.

15. A semiconductor device, comprising:
    a source/drain formed in a substrate;
    a gate structure formed over the substrate;
    a first via disposed over and electrically coupled to the source/drain;
    a first interlayer dielectric (ILD) disposed over the first via and over the gate structure;
    a second ILD disposed over the first ILD;
    a second via that extends vertically through the first ILD, wherein the second via is electrically coupled to the first via;
    a third via that extends vertically through the second ILD, wherein the third via is electrically coupled to the second via, wherein a bottom surface of the third via is wider than a top surface of the second via; and
    a fourth via that extends vertically through the second ILD and through the first ILD, wherein the fourth via is electrically coupled to the gate structure.

16. The semiconductor device of claim 15, further comprising:
    an etching-stop layer (ESL) disposed over the gate structure but below the second ILD; and
    dielectric spacers disposed on side surfaces of the second via, wherein the dielectric spacers and the ESL have a same material composition.

17. The semiconductor device of claim 15, wherein the gate structure is a first gate structure, and wherein the semiconductor device further comprises a second gate structure that is disposed adjacent to the first via, and wherein no vias are formed directly above the second gate structure.

18. The semiconductor device of claim 15, wherein the third via is laterally shifted with respect to the second via.

19. The semiconductor device of claim 15, further comprising dielectric spacers formed on side surfaces of the second via, wherein a bottom surface of the third via is formed directly over at least a portion of an upper surface of the dielectric spacers.

20. The semiconductor device of claim 15, wherein an entirety of the top surface of the second via is in direct contact with the bottom surface of the third via.

* * * * *